(12) United States Patent
Becker et al.

(10) Patent No.: US 9,859,452 B1
(45) Date of Patent: Jan. 2, 2018

(54) FABRICATION OF THIN-FILM PHOTOVOLTAIC CELLS WITH REDUCED RECOMBINATION LOSSES

(71) Applicant: INTERNATIONAL BUSINESS MACHINES CORPORATION, Armonk, NY (US)

(72) Inventors: Christian Becker, Mainz (DE); Hans-Juergen Eickelmann, Mainz (DE); Hauke Pflueger, Nieder-Olm (DE); Markus Schmidt, Mainz (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/198,204

(22) Filed: Jun. 30, 2016

(51) Int. Cl.
*H01L 31/061* (2012.01)
*H01L 31/0296* (2006.01)
(Continued)

(52) U.S. Cl.
CPC .......... *H01L 31/061* (2013.01); *H01L 31/028* (2013.01); *H01L 31/0296* (2013.01); *H01L 31/022441* (2013.01); *H01L 31/0322* (2013.01); *H01L 31/0326* (2013.01); *H01L 31/0445* (2014.12); *H01L 31/1868* (2013.01); *H01L 2031/0344* (2013.01)

(58) Field of Classification Search
None
See application file for complete search history.

(56) References Cited

U.S. PATENT DOCUMENTS

| 8,574,950 B2 * | 11/2013 | Clevenger | H01L 31/02164 |
| | | | 136/256 |
| 2010/0236619 A1 * | 9/2010 | Tsutsumi | H01L 31/02243 |
| | | | 136/256 |

(Continued)

OTHER PUBLICATIONS

Velten et al., "Roll-to-Roll Hot Embossing of Microstructures", Microsystems Technologies, May 2010 (6 pages).

(Continued)

*Primary Examiner* — Andres Munoz
(74) *Attorney, Agent, or Firm* — Noah Sharkan, Esq.; Kevin P. Radigan, Esq.; Heslin, Rothenberg, Farley & Mesiti

(57) ABSTRACT

Methods are provided for fabricating photovoltaic cell contacts, which include: providing a block copolymer layer above an electrical contact layer of the photovoltaic cell, the block copolymer layer being self-assembled by phase segregation to include multiple structures of a first polymer material surrounded, at least in part, by a second polymer material; selectively etching the block copolymer layer to remove the multiple structures, forming holes in the block copolymer layer; and using the holes in the block copolymer layer to facilitate providing electrical contacts between a light absorption layer of the photovoltaic cell and the electrical contact layer. For instance, the holes in the copolymer layer may be used in etching a passivation layer over the electrical contact layer to form nano-sized contact openings in the passivation layer to the contact layer. Once provided, the cell's light absorption material forms contacts extending through the contact openings in the passivation layer.

18 Claims, 7 Drawing Sheets

(51) Int. Cl.
*H01L 31/028* (2006.01)
*H01L 31/032* (2006.01)
*H01L 31/0224* (2006.01)
*H01L 31/0445* (2014.01)
*H01L 31/18* (2006.01)
*H01L 31/0256* (2006.01)

(56) References Cited

U.S. PATENT DOCUMENTS

| | | |
|---|---|---|
| 2011/0104850 A1 | 5/2011 | Weidman et al. |
| 2012/0263915 A1* | 10/2012 | Millward ............ B81C 1/00031 428/120 |
| 2013/0081683 A1* | 4/2013 | Masunaga ............... H01L 31/06 136/255 |
| 2014/0182677 A1* | 7/2014 | Fujimoto .......... H01L 31/02168 136/257 |

OTHER PUBLICATIONS

Schmidt et al., "Directed Self Assembly Nanocontacts for CIGS, CZTS, . . . Thin Film Solar Cells", IBM Germany, 2015 (3 pages).

* cited by examiner

US 9,859,452 B1

FABRICATION OF THIN-FILM PHOTOVOLTAIC CELLS WITH REDUCED RECOMBINATION LOSSES

BACKGROUND

A thin film solar cell (TFSC) or thin film photovoltaic cell (TFPV) is a second generation solar cell made by depositing one or more thin layers, or thin films (TFs), of light absorption material on a substrate, such as a glass, plastic or metal substrate. Thin film solar cells are commercially used in several technologies, including cadmium telluride (CdTe), copper-indium-gallium-selenide (CIGS), and amorphous and other thin film silicon (a-Si, TF-Si). There are other second generation thin film photovoltaic cell technologies that are in early stage of research. These include copper-zinc-tin-sulfide (CZTS) and Perovskite solar cells.

Film thicknesses can vary from a few nanometers to tens of micrometers, much thinner than the conventional, first generation crystalline silicon solar cell (c-Si), which typically utilize silicon wafers of, for instance, 200 micrometers thickness or greater. This difference advantageously allows thin film photovoltaic cells to be flexible, lower in weight, and have less drag compared with first generation solar cells.

In order for thin film photovoltaic cell technology to make further advances in the marketplace, improved thin film photovoltaic cell designs and fabrication techniques are desired.

SUMMARY

The shortcomings of the prior art are overcome and additional advantages are provided through the provision, in one aspect, of a method of fabricating photovoltaic cell contacts, which includes: providing a block copolymer layer above an electrical contact layer of the photovoltaic cell, the block copolymer layer being self-assembled by phase segregation to include multiple structures of a first polymer material surrounded, at least in part, by a second polymer material; selectively etching the block copolymer layer to remove the multiple structures, forming holes in the block copolymer layer; and using the holes in the block copolymer layer to facilitate providing electrical contacts between a light absorption layer of the photovoltaic cell and the electrical contact layer of the photovoltaic cell.

In another aspect, a method of fabricating a photovoltaic cell is provided which includes: providing an electrical contact layer with a passivation layer over the electrical contact layer; providing a block copolymer layer over the passivation layer, the block copolymer layer being self-assembled by phase segregation to include multiple structures of a first polymer material surrounded, at least in part, by a second polymer material; selectively etching the block copolymer layer to remove the multiple structures, forming holes in the block copolymer layer; etching the passivation layer through the holes in the block copolymer layer to form contact openings in the passivation layer; and providing a light absorption layer of the photovoltaic cell, the light absorption layer extending into the contact openings in the passivation layer and making electrical contact with the electrical contact layer.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
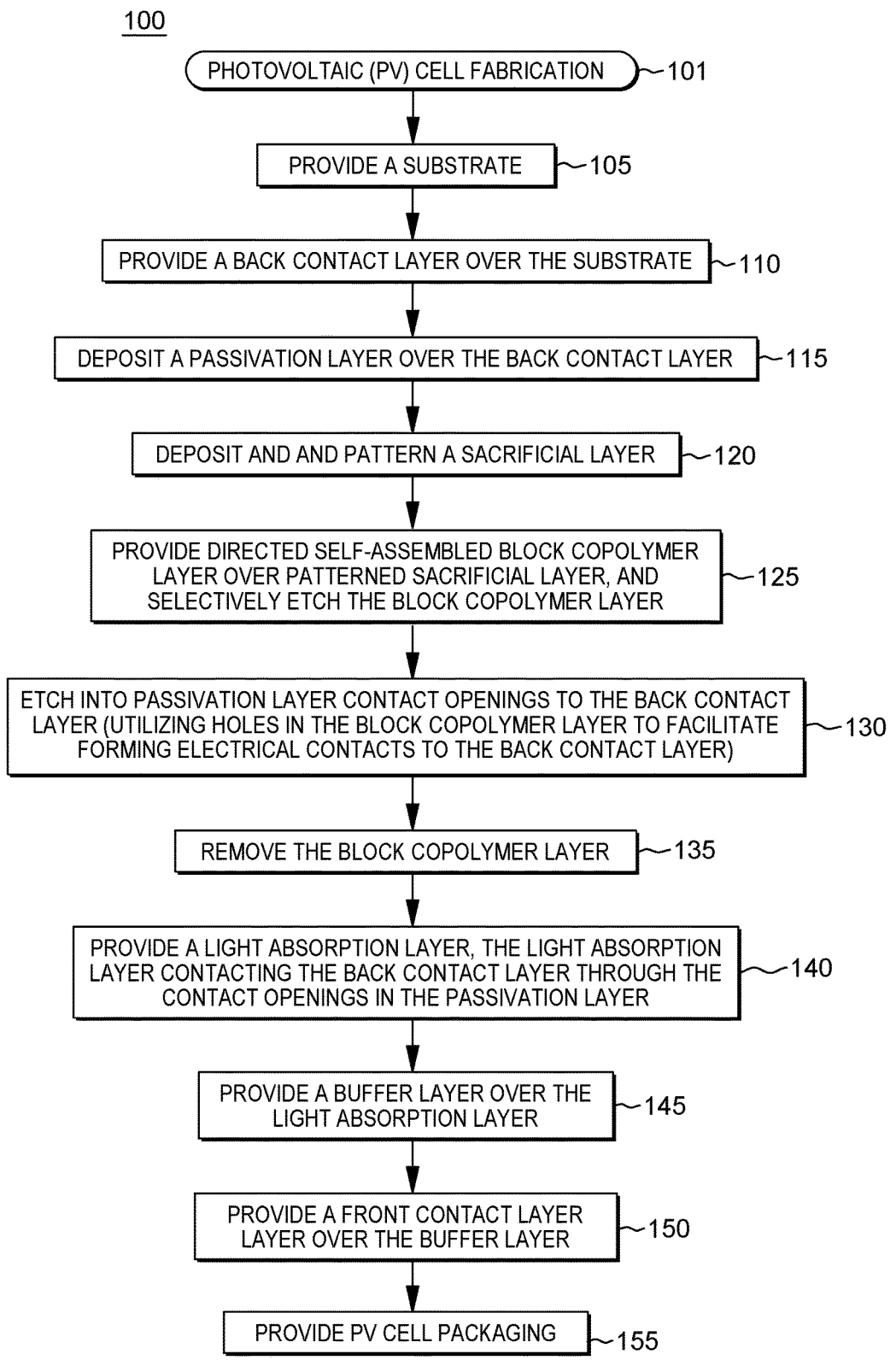
FIG. 1 depicts one embodiment of a process of fabricating a photovoltaic cell, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

As understood in the art, photovoltaics generally refers to converting solar energy into direct current electricity using semiconductor materials that exhibit the photovoltaic effect. A photovoltaic system employs solar panels comprising a number of photovoltaic cells to supply usable solar power. Current second generation solar or photovoltaic cells employ thin film semiconductor materials as the solar absorber or light absorption layer. A number of semiconductor materials have been proposed or used in thin film solar cells, including copper-indium-gallium-selenide (CIGS), copper-zinc-tin-sulfide/selenide (CZTS), and organic- or inorganic-Perovskite, along with others. Conventional thin film photovoltaic cells include an absorber material disposed between an ohmic contact and a transparent contact, which allows light to reach the absorber layer.

One way to reduce cost of energy for photovoltaic cell systems is to improve efficiency of the device. Proper identification and elimination of loss mechanisms, while optimizing the cost of manufacturing the device, can lead to further cost reduction and aid in scaling of the levelized cost of electricity (LCOE) of the technology, while the solar industry is ramping up manufacturing capacity into the multi-GW-scale. One large contribution to losses is recombination at the front-side or back-side surfaces of the light absorption layer to the front and back contact layers, respectively. A need exists therefore for improved thin film solar cell designs with reduced recombination losses. In addition, there is a need to continue to increase manufacturing throughput in thin film solar cell manufacturing of certain photovoltaic cells.

Recombination losses between the front and/or back side contacts to the light absorption layer may be reduced by providing smaller sized contacts. By way of example, nano-sized point contacts may be provided in combination with one or more suitable passivation layers at the interface between, for example, the back contact and light absorption layers of the photovoltaic cell. Note that as used herein, a "point contact" is a contact with a characteristic dimension less than 1 for instance, 500 nms or less, such as less than 200 nms, or more particularly, 50 nms, or smaller, such as 20 nms or less. These point contacts are also referred to herein as nano-sized point contacts, or nano-sized contacts. In one or more implementations, nano-sized contacts may be manufactured using, for instance, relatively expensive electron beam lithography, or nano-imprinting lithography and etch processes. Other methods to produce such small point contacts may include shadow-masking, with nano-particles and deposition of a passivation layer, but the layer thickness is limited to allow lift-off. Certain drawbacks to these approaches are that they are expensive to implement, and they constrain manufacturing throughput.

Presented herein therefore, are unique fabrication approaches to producing photovoltaic cells with point contacts between the light absorption layer (or absorber) and one or both of the electrical contact layer interfaces to the light absorption layer. In particular, nano-sized contacts are provided by, in part, introducing a block copolymer self-assembly, or block copolymer directed self-assembly, step into the fabrication process. The use of block copolymer self-assembly advantageously removes the need to imprint nano-sized contact openings, thereby providing cost advantages to producing point contacts compared with the above-noted approaches. Advantageously, using the fabrication approaches described herein, nano-sized point contacts may be readily provided at the interface between, for instance, the back contact and light absorption layer of the photovoltaic cell, thereby reducing surface recombination at the interface, and increasing photovoltaic cell efficiency, while still producing the thin-film photovoltaic cells cost effectively.

Generally stated, disclosed herein in one or more aspects is a method of fabricating photovoltaic cell contacts, which includes: providing a block copolymer layer above an electrical contact layer of the photovoltaic cell, the block copolymer layer being self-assembled by phase segregation to include multiple structures of a first polymer material surrounded, at least in part, by a second polymer material; selectively etching the block copolymer layer to the multiple structures, forming holes in the block copolymer layer; and using the holes in the block copolymer layer to facilitate providing electrical contacts between a light absorption layer of the photovoltaic cell and the electrical contact layer of the photovoltaic cell.

In certain directed self-assembly embodiments, the fabricating further includes: providing, before depositing the block copolymer layer, a patterned sacrificial layer above the electrical contact layer, the patterned sacrificial layer comprising patterned openings through the patterned sacrificial layer; and the providing of the block copolymer layer includes depositing the block copolymer layer over the patterned sacrificial layer, including within the patterned openings, wherein the multiple structures of the first polymer material, and thus the holes in the block copolymer layer, are disposed within the patterned openings in the patterned sacrificial layer. In one or more implementations, the patterned openings may be regularly arrayed within the patterned sacrificial layer.

In one or more other self-assembly embodiments, the holes in the block copolymer layer may be randomly disposed above the electrical contact layer.

In certain implementations, the fabricating further includes providing, prior to providing the block copolymer layer, a passivation layer over the electrical contact layer, wherein the using includes etching the passivation layer through the holes in the block copolymer layer to form contact openings through the passivation layer. The contact openings through the passivation layer facilitate forming electrical contacts between the light absorption layer and the electrical contact layer. In one or more implementations, the fabricating may further include providing the light absorption layer, with the light absorption layer extending into the contact openings through the passivation layer, and forming the electrical contacts to the electrical contact layer. By way of example, the light absorption layer may be formed of a thin-film semiconductor material, and have a thickness of 5 microns or less. In one or more embodiments, the thin-film semiconductor material may include one of cadmium telluride (CdTe), amorphous or other thin-film silicon (a-Si, TF-Si), copper-indium-gallium-selenide/sulfide (CIGS), copper-zince-tin-sulfide (CZTS), or any organic- or inorganic-Perovskite material. In certain embodiments, the holes in the block copolymer layer may be 200 nms in width, or less, such as 50 nms, or even 20 nms, in width or less. In one or more embodiments, the electrical contact layer is a back contact layer interface to the light absorption layer of the photovoltaic cell.

In one or more other implementations, a method of fabricating a photovoltaic cell is provided which includes: providing an electrical contact layer with a passivation layer over the electrical contact layer; providing a block copolymer layer over the passivation layer, the block copolymer layer being self-assembled by phase segregation to include multiple structures of a first polymer material surrounded, at least in part, by a second polymer material; annealing the block copolymer layer to dissolve the multiple structures, forming holes in the block copolymer layer; etching the passivation layer through the holes in the block copolymer layer to form contact openings in the passivation layer; and providing a light absorption layer of the photovoltaic cell, the light absorption layer extending into the contact openings in the passivation layer and making electrical contact with the electrical contact layer. Those skilled in the art should note that each of the above-summarized enhanced implementations, including the directed and random self-assembly approaches, may be used in combination with this photovoltaic cell fabrication approach.

Reference is made below to the drawings, which are not drawn to scale for ease of understanding, wherein the same reference numbers used throughout different figures designate the same or similar components.

FIG. 1 illustrates one embodiment of a fabrication process 100 for photovoltaic (PV) cell fabrication 101, in accordance with one or more aspects of the present invention. As shown, fabrication process 100 may include providing a substrate 105 and a back contact layer (or back-side contact to the light absorption material) over the substrate 110. A passivation layer, such as a dielectric film, may be deposited over the back contact layer 115, and in this embodiment, a patterned sacrificial layer may be provided by depositing and patterning a sacrificial layer to include patterned openings through the patterned sacrificial layer 120. A block copolymer layer is provided over the patterned sacrificial layer, including within the patterned openings, and then selectively etched 125. Note in this regard, that the block copolymer layer is directed self-assembled by phase segregation into multiple structures of a first polymer material surrounded, at least in part, by a second polymer material. The multiple structures of the first polymer material may be directed to form, in one or more embodiments, within the patterned openings in the patterned sacrificial layer, such that the selective etching of the block copolymer forms holes in the block copolymer layer within the patterned openings in the patterned sacrificial layer. As will be understood by one skilled in the art, different processes for the selective etching may be utilized depending, for instance, on the chosen set of polymers in the copolymer layer. For instance, bonds may be broken and the first polymer material dissolved by UV exposure and solution etching, plasma etching, reactive ion etching (RIE), etc.

Advantageously, the copolymer materials are selected so that the holes in the block copolymer layer are smaller than the patterned openings in the patterned sacrificial layer. By way of example, through selection of the block copolymer materials, a desired number of directed self-assembled structures may be generated by phase segregation, including structures such as cylinders or lamellar structures. The size or characteristic width of these structures, and therefore, the resultant holes, may be adjusted through selection of different characteristics and/or polymers for the block copolymer material, as understood by a person skilled in the art. Those skilled in the art will understand that the self-assembly process depends on a number of parameters, such as surface preparation, thickness of the block copolymer layer, length of the blocks, asymmetry of the block length, sidechain characteristics, a stiffness contrast between the chosen polymers of the copolymer layer, the chosen molecular weight ($M_w$) and Flory-Huggins interaction parameter "chi". In certain cases, in order to achieve ordering, methods to overcome slow kinetics might be used, such as plasticizer(s) or vapor-annealing. Slow kinetics is the results of using, for instance, large block lengths, that is, high-molecular-weight polymers.

Fabrication process 100 may further include etching the passivation layer with contact openings to the back contact layer 130. The etching of the passivation layer may utilize the small holes in the block copolymer layer, after which the block copolymer material may be removed 135. A light absorption layer, such as thin-film semiconductor material, may be provided above the etched passivation layer, with the light absorption layer making electrical contact with the back contact layer through the etched contact openings in the passivation layer 140. The photovoltaic cell may subsequently be completed by, for instance, providing a buffer layer over the light absorption layer 145, providing a front contact layer over the buffer layer 150, and further providing photovoltaic cell packaging for the resultant structure 155.

Note in this regard, that although describing fabrication of a photovoltaic cell, those skilled in the art will understand that the processes described herein may be employed to manufacture in parallel a plurality of photovoltaic cells for, for instance, a solar panel or other solar device. Further, note that the referenced photovoltaic cell packaging may include first and second electrodes of the photovoltaic cell, in respective electrical contact with, for instance, the back contact and front contact layers.

FIGS. 2A-2G depict one detailed embodiment of the above-noted process of fabricating a photovoltaic cell, in accordance with one or more aspects of the present invention.

Figure 2A:
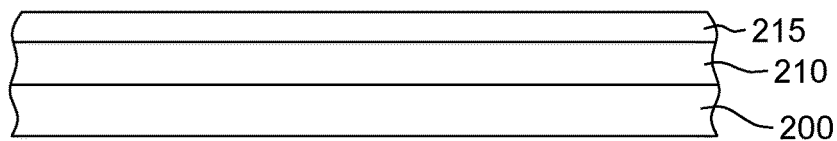
FIGS. 2A-2G depict one embodiment of a photovoltaic cell being fabricated using the process of FIG. 1, in accordance with one or more aspects of the present invention.

Referring to the structure of FIG. 2A, a substrate 200 may be provided of a desired material, size and thickness. As examples, substrate 200 may include a glass substrate, a polymer foil substrate, etc., and have (for instance) a thickness of 1 mm, or less. A back contact layer 210 may be provided over substrate 200. The back contact layer 210 may include any desired back-side contact material or materials, such as Mo, ZnO, ZnO:Al, etc., and may have any desired thickness, such as, for instance, a thickness in the range of 1-1.5 μms, in one specific example. As shown, a passivation layer 215 may be deposited over back contact layer 210. The passivation layer 215 may be a thin dielectric film, for instance, in the range of 20 nms or less, and may include, by way of example, $Al_2O_3$, $MgF_2$, etc., which have beneficial properties when adjacent to or in contact with the thin-film light absorption layer to be applied.

Figure 2B:
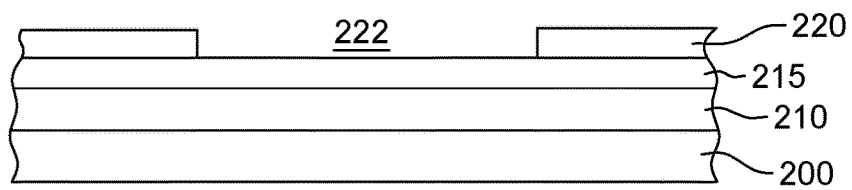

FIG. 2B depicts the structure of FIG. 2A, after a sacrificial layer 220 has been deposited and patterned with patterned openings 222 exposing passivation layer 215. In one or more embodiments, sacrificial layer 220 may be a polymer layer that is applied and embossed to include the desired patterned openings 222. This may be performed, for instance, in a roll-to-roll manufacturing process by hot-embossing a polymer layer as the sacrificial layer. As one specific example, the sacrificial layer 220 may have a thickness of 500 nms or less. Further, the polymer material of the sacrificial layer may be, for instance, a photoresist, or, for instance, a PMMA material. Note that the patterned openings 222 may take on any desired configuration, and may include, for instance, a regular array of openings in sacrificial layer 220. Patterned openings 222 are provided to facilitate directed self-assembly of the subsequently applied block copolymer material, that is, the patterned openings 222 direct formation of the phase-segregated structures from the block copolymer within the openings 222. As such, the number and the array of patterned openings may be adjusted to facilitate forming a desired electrical contact layout between the back contact and light absorption layers of the photovoltaic cell, as will be understood by those skilled in the art from the description provided herein.

Figure 2C:
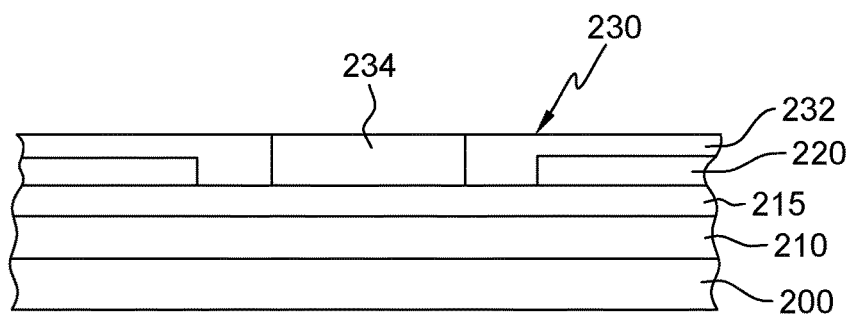

As illustrated in FIG. 2C, a block copolymer layer 230 may be deposited over patterned sacrificial layer 220, with block copolymer layer 230 aligning or being directed towards the previously-provided, patterned sacrificial layer 220. In particular, block copolymer layer 230 self-assembles by phase segregation to include multiple structures 234 of a first polymer material surrounded, at least in part, by a second polymer material 232, with multiple structures 234 being aligned towards patterned openings 222 (FIG. 2B) in patterned sacrificial layer 220, such that the multiple structures 234 reside, at least in part, within the patterned openings.

By way of specific example, the first polymer material may be polystyrene (PS), and the second polymer material PMMA. However, other combinations of copolymers may be employed in this process, as will be understood by one skilled in the art. For instance, as a different combination, PB-b-PDMS (polystyrene-b-polydimethylsiloxane), PS-b-PEO (polystyrene-b-polyethyleneoxide), or PS-b-PFS (polystyrene-b-polyferrocenylsilane) may be employed, or polymeric conducting, anorganic and metal-containing blocks, etc. Advantageously, the copolymer materials may be selected so that a light annealing facilitates the self-assembly by phase segregation of the polymers, which results in the multiple structures of the first polymer material 234 forming and residing within the patterned openings 222 (FIG. 2B) in sacrificial layer 220. In this manner, by providing the sacrificial layer with the patterned openings, location of the multiple structures 234 over passivation layer 215 may be controlled or directed. As noted, in one or more implementations, the multiple structures 234 may be regularly arrayed over at least a portion of the passivation layer, for example, within regularly-arrayed, patterned openings in the patterned sacrificial layer. By way of example, the copolymer layer may be formed by dip-coating, printing, solution casting, spin-coating, etc., the block copolymer material over, for instance, the patterned sacrificial layer, including within the patterned openings. The thickness of the block copolymer layer may vary, and be, for instance, within a range of 45-100 nm, or thicker, depending upon the implementation. Further, by way of example, the annealing temperature might be in the range of 150° C.-250° C., in one or more implementations.

As understood, the driving force in the phase segregation process is the immiscibility of the different polymers in the block copolymer layer. However, the polymers are covalently bonded together, and hence cannot move a great distance apart. The arrangement is also sensitive to constraints, such as surfaces. If a surface is wet by one of the polymers, the other will try to move away from that surface. Thus, preparation of the surfaces may be used as a constrained template for registration of an ordered block copolymer structure to the surface. In one or more implementations, a neutral substrate layer may be required, e.g., by preparation of the surface with a polymer brush layer, or adding a neutral topcoat layer. In one or more embodiments, the block copolymer material forms concentric structures within the patterned openings, where, for instance, as one specific example, PMMA polymer material may be surrounded in a circular manner by PS polymer material within the contact opening. The PMMA may be selectively removed or etched, from the resultant phase-segregated layer. As noted, in one or more implementations, the block copolymer layer may be formed by, for instance, spin-coating the block copolymer over the patterned sacrificial layer, filling the patterned holes, and then subsequently annealing the structure.

Figure 2D:
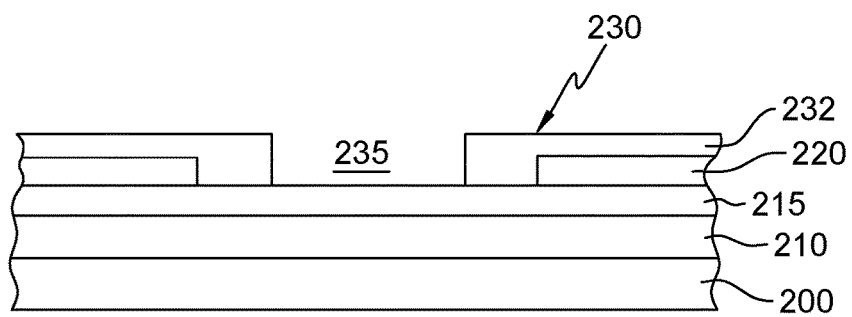

The block copolymer layer 230 is etched to dissolve or remove the first polymer material structures 234 (FIG. 2C) from block copolymer layer 230, leaving holes 235 in block copolymer layer 230 within the patterned openings of sacrificial layer 220, as illustrated in FIG. 2D. Advantageously, holes 235 in block copolymer layer 230 are smaller than patterned openings 220 (FIG. 2B) in sacrificial layer 220 within which they may reside. In one or more implementations, holes 235 in block copolymer layer 230 are smaller than can be achieved using, for instance, conventional photoresist processing, and imprinting using a roll-to-roll manufacturing process for thin-film solar cell fabrication. In traditional imprint processing, holes on the order of 1 μm may be achieved, but with the processing described herein, holes 235 may be on the order of, for instance, 500 nms or less, such as 200 nms or smaller, or even 50 nms or less, for example, in the range of 10-30 nms.

Figure 2E:
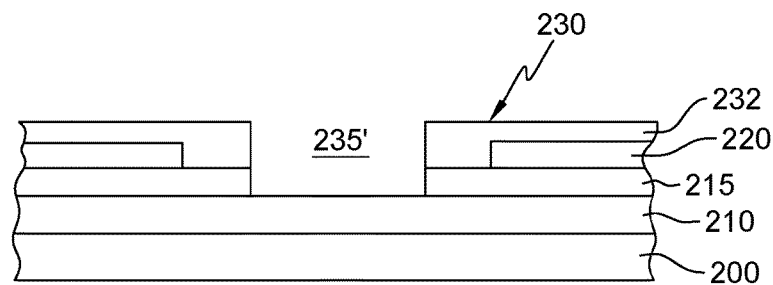

FIG. 2E depicts the structure of FIG. 2D after etching passivation layer 215 to form contact openings 235' extending through passivation layer 215 and exposing portions of back contact layer 210. By way of example, the etching of passivation layer 215 may be by etching methods, such as wet etching, reactive ion etching (RIE), etc. As illustrated, contact openings 235' in passivation layer 215 align with the holes in block copolymer layer 230.

Figure 2F:
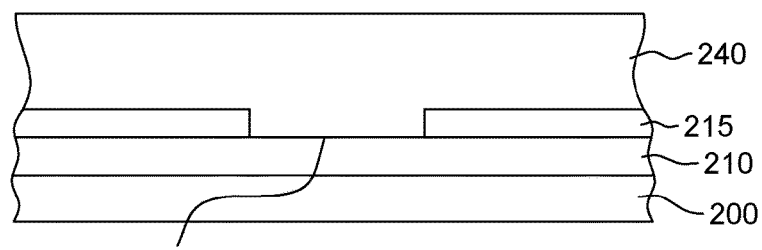

As illustrated in FIG. 2F, further processing of the structure of FIG. 2E may include removal of the remaining block copolymer layer 230 (FIG. 2E), and sacrificial layer 220 (FIG. 2E), and depositing a light absorption layer 240 over the structure, including within the contact openings, such that the light absorption layer 240 is in electrical, point contact 245 with back contact layer 210. By way of example, removal of the block copolymer layer and sacrificial layers may be achieved by using a suitable solvent, such as NMP. Note that light absorption layer 240 may be formed of any suitable semiconductor material which is light-absorbing. By way of example, the light-absorbing material could include a thin-film semiconductor material, such as cadmium telluride (CdTe), amorphous or other thin-film silicon (a-Si, TF-Si), copper-indium-gallium-selenide/sulfide (CIGS), copper-zinc-tin-sulfide (CZTS), organic- or inorganic-perovskite, etc., and may be deposited using, for instance, co-evaporation or sputtering processes. Note in this regard, that the desired spacing between the point contacts 245 interfacing light absorption layer 240 and back contact layer 210 may depend, for instance, on the light absorption material selected. If the absorption material has a long diffusive length of charges generated before recombining, then larger spacing between contacts 245 may be allowed. If the light absorption material has a short free diffusion length of generated charges, then smaller separation between the contacts 245, as well as smaller-sized point contacts 245, may be desired. The desired spacing may be achieved using, for instance, grapho-epitaxy processing, where the spacing may be chosen by the method used to perform the initial patterned layer (for instance, through hot-embossing of a polymer layer). It is also possible to achieve the desired dimensions using chemo-epitaxy, but this approach might require modification of block lengths and may be more restricted in dimensions/spacings that can be achieved.

Figure 2G:
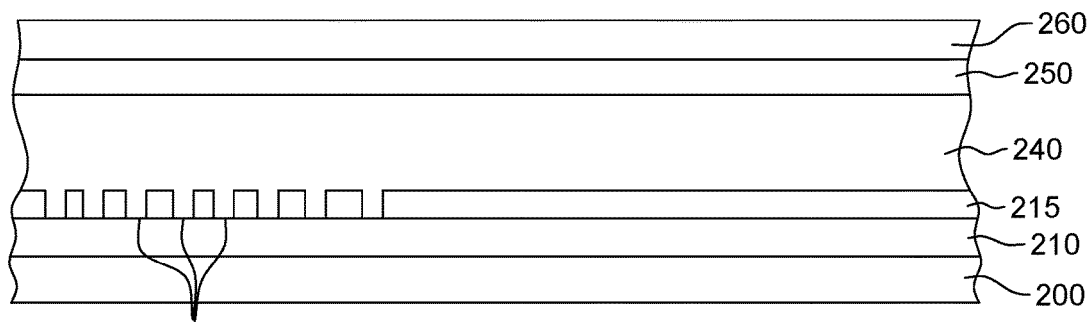

FIG. 2G depicts a photovoltaic cell after further processing, wherein a buffer layer 250 is added over the light absorption layer 240, and a front contact layer 260 is provided over buffer layer 250. By way of example, buffer layer 250 may be a thin dielectric film deposited over the light absorption layer using, for instance, atomic layer deposition, sputtering, etc. In one or more embodiments, the buffer layer may include $Al_2O_3$, $MgF_2$, etc., and have a thickness of, for instance, 5-50 nms. The front contact layer 260 may be, in one or more implementations, a transparent conducting oxide (TCO) layer formed, for instance, by sputter deposition of ITO or AZO, with a thickness in the range of 200-1700 nm. Although not shown, photovoltaic cell packaging may be further provided, which may including providing metallizations electrically connecting to back contact layer 210 and front contact layer 260 of the photovoltaic cell.

Figure 3:
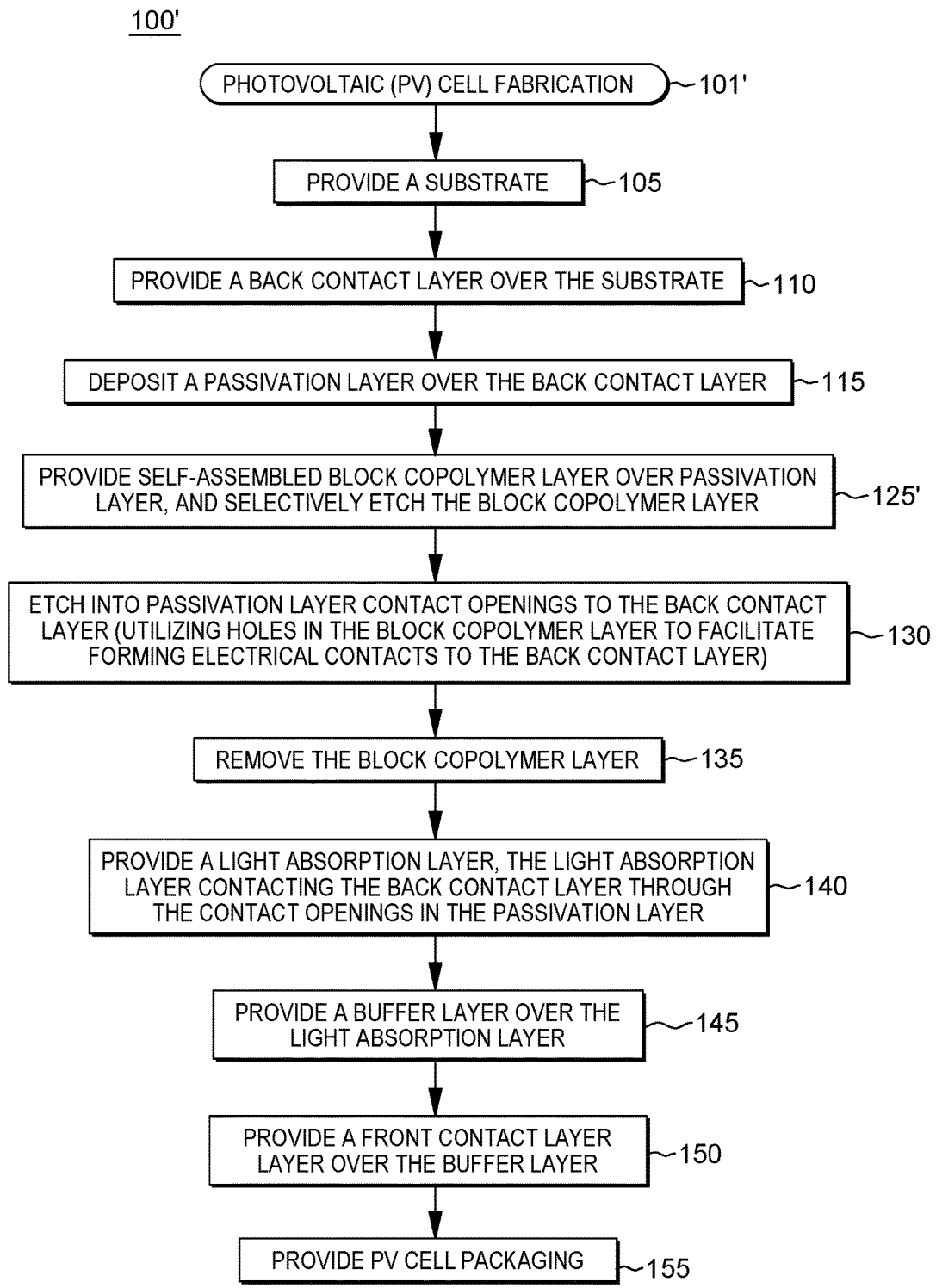
FIG. 3 depicts another embodiment of a process of fabricating a photovoltaic cell, in accordance with one or more aspects of the present invention.

FIG. 3 depicts an alternate embodiment of a fabrication process 100' for photovoltaic (PV) cell fabrication 101', in accordance with one or more aspects of the present invention. As illustrated, fabrication process 100' of FIG. 3 is similar to fabrication process 100 of FIG. 1. A principal difference in the fabrication process of FIG. 3 is the removal of the steps of depositing and patterning a sacrificial layer. Thus, although providing a self-assembled block copolymer layer, the process of FIG. 3 is not directed, and therefore the resultant holes in the block copolymer layer may be randomly dispersed over the passivation layer.

Referring to FIG. 3, fabrication process 100' may include providing a substrate 105, and a back contact layer (or back-side contact to the light absorption material) over the substrate 110. A passivation layer, such as a dielectric film, may be deposited over the back contact layer 115. As outlined, a block copolymer layer is provided over the passivation layer, and then selectively etched 125'. Advantageously, the block copolymer layer is annealed to facilitate self-assembly by phase segregation into multiple structures of a first polymer material surrounded, at least in part, by a second polymer material. The size of the resultant structures of the first polymer material may be controlled by, for instance, selection of appropriate polymers for the block copolymer layer, as understood by those skilled in the art. The selective etching of the block copolymer layer may be performed to dissolve or remove the multiple structures of the first polymer material from the layer, leaving nano-sized holes in the block copolymer layer. These holes in the block copolymer layer may be, in one or more implementations, randomly disposed above the passivation layer. In one or more implementations, polymer size may be controlled by molecular weight, with the molecular weight of the polymers depending on the polymerization methods and conditions chosen, such as concentration of monomers. In one or more embodiments, a polymer size distribution is achieved, with certain polymerization methods able to achieve small dispersion.

Fabrication process 100' may further include etching the passivation layer with contact openings to the back contact layer 130. This etching of the passivation layer is, in one or more implementations, through the small holes in the block copolymer layer, after which the block copolymer layer may be removed 135. A light absorption layer, such as a thin-film semiconductor material, is subsequently provided above the etched passivation layer, with the light absorption layer making electrical contact with the back contact layer through the etched contact openings in the passivation layer 140. The photovoltaic cell may subsequently be completed by, for instance, providing a buffer layer over the light absorption layer 145, providing a front contact layer over the buffer layer 150, and further providing photovoltaic cell packaging for the resultant structure 155. As noted above, the photovoltaic cell packaging may include, for instance, first and second metal electrodes of the photovoltaic cell in respective electrical contact with the back contact layer and the front contact layer of the structure.

FIGS. 4A-4F depict a detailed embodiment of the above-noted process of fabricating a photovoltaic cell, in accordance with one or more aspects of the present invention.

Figure 4A:
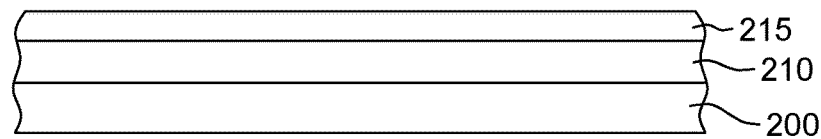
FIGS. 4A-4F depict one embodiment of a photovoltaic cell being fabricated using the process of FIG. 3, in accordance with one or more aspects of the present invention.

Referring to the structure of FIG. 4A, a substrate 200 may be provided of any desired material, size and thickness. By way of example, substrate 200 may be or include a glass substrate, a polymer foil substrate, etc., and have (for instance) a thickness of 1 mm, or less. A back contact layer 210 is provided over substrate 200, with the back contact layer comprising any back-side contact material or materials appropriate for a photovoltaic cell, such as Mo, ZnO, ZnO:Al, etc., and it may have any desired thickness, such as, for instance, a thickness in the range of 1-1.5 μms. As shown, a passivation layer 215 may be deposited over back contact layer 210, with the passivation layer being, for instance, a thin dielectric film. By way of example, passivation layer 215 may have a thickness in the range of 20 nms or less, and may include, by way of example, $Al_2O_3$, $MgF_2$, etc., which have beneficial properties when adjacent to or in contact with the thin-film light absorption layer to be applied.

Figure 4B:
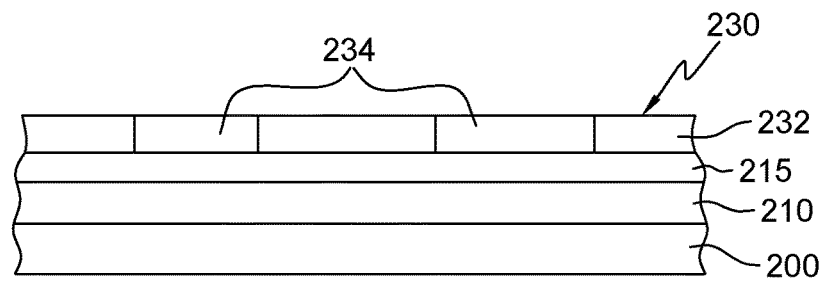
Figure 4C:
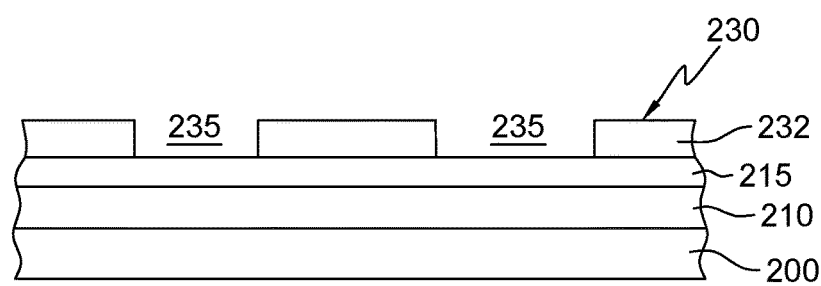

FIG. 4B depicts the structure of FIG. 4A, after block copolymer layer 230 is deposited over passivation layer 215. As illustrated, block copolymer layer 230 self-assembles by phase segregation to include multiple structures 234 of a first polymer material surrounded, at least in part, by a second polymer material 232. In one or more implementations, these multiple structures 234 may be randomly assembled or disposed over passivation layer 215. As noted above, in one or more implementations, the first polymer material may be polystyrene (PS), and the second polymer material (PMMA). However, other combinations of copolymers may be employed in this process, with the copolymer materials being selected so that the self-assembly by phase segregation of the polymer results in the multiple structures of the first polymer material 234 being of a desired size and/or shape, as will be understood by one skilled in the art. The block copolymer layer 230 is selectively etched to remove the first polymer material from the block copolymer layer, leaving holes 235 in block copolymer layer 230, exposing portions of passivation layer 215, as illustrated in FIG. 4C. Advantageously, holes 235 in block copolymer layer 230 may be smaller than achievable using, for instance, conventional photoresist processing, and imprinting using roll-to-roll manufacturing process for thin-film solar cell fabrication. For instance, holes 235 may be on the order of 500 nms or less, such as 200 nms or less, or even 50 nms or less, for example, in the range of 10-30 nms.

Figure 4D:
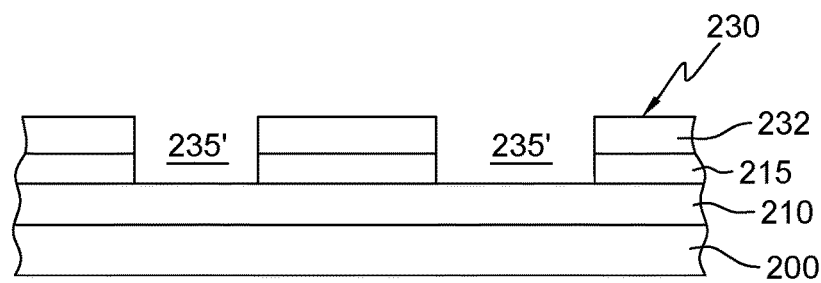
Figure 4E:
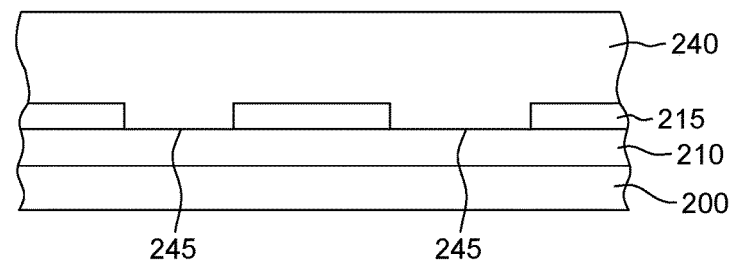

FIG. 4D depicts the structure of FIG. 4C after etching passivation layer 215 to form contact openings 235' extending through passivation layer 215, and exposing portions of back contact layer 210. As illustrated in FIG. 4E, further processing of the structure may include removal of the remaining block copolymer layer 230 (FIG. 4D), and depositing a light absorption layer 240 over the structure, including within the contact openings 235' (FIG. 4D), such that the light absorption layer 240 is in electrical, point contact 245 with back contact layer 210.

As noted above, light absorption layer 240 may be formed of any suitable semiconductor material which is light-absorbing. By way of example, the light-absorbing material could include a thin-film semiconductor material, such as cadmium telluride (CdTe), amorphous or other thin-film silicon (a-Si, TF-Si), copper-indium-gallium-selenide/sulfide (CIGS), copper-zinc-tin-sulfide (CZTS), or organic- or inorganic-perovskite, etc., and may be deposited using, for instance, co-evaporation or sputtering processes. Note in this regard, that the desired spacing between the point contacts 245 interfacing light absorption layer 240 and back contact layer 210 may depend, for instance, on the light absorption material selected, or more particularly, on the diffusive length of charges generated before recombining. Note also in this regard, that the random nature of the point contacts 245 using this fabrication process, may mean that a smaller separation between the contacts, as well as smaller-sized contacts, may be desired, which can be achieved by appropriate selection of the polymer materials within the block copolymers. A random distribution of holes is inherently achieved if no special precautions are taken to registrate the holes to the substrate. A random distribution may be acceptable for certain applications, but in other cases, it may be more desirable in terms of passivation of the surface if the arrangement is more highly regular, or arrayed, which could be achieved by using a form of grapho-epitaxy or chemo-eptiaxy, as described herein.

Figure 4F:
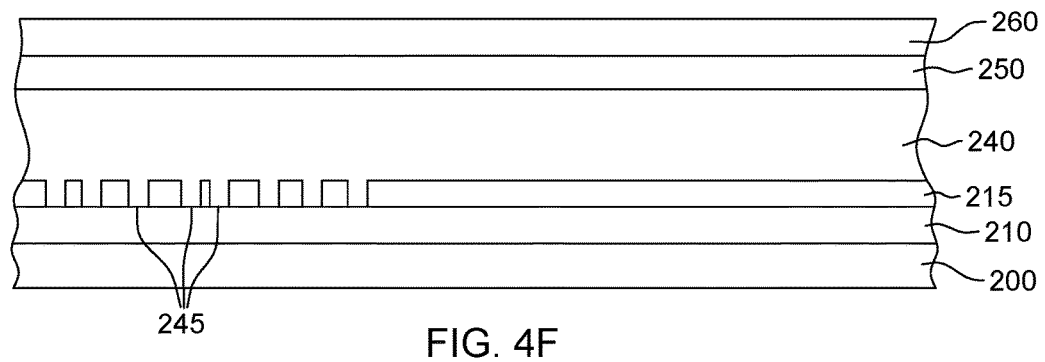

FIG. 4F depicts a photovoltaic cell after further processing, wherein a buffer layer 250 is added over light absorption layer 240, and a front contact layer 260 is provided over buffer layer 250. As noted above, buffer layer 250 may be a thin dielectric film deposited over the light absorption layer using, for instance, atomic layer deposition, sputtering, etc. In one or more embodiments, the buffer layer may include $Al_2O_3$, $MgF_2$, etc. The front contact layer 260 may be, in one or more implementations, a transparent conducting oxide (TCO) layer. Although not shown, photovoltaic cell packaging may be further provided, which may include metallizations electrically connecting to back contact layer 210 and front contact layer 260 of the photovoltaic cell.

Figure 5:
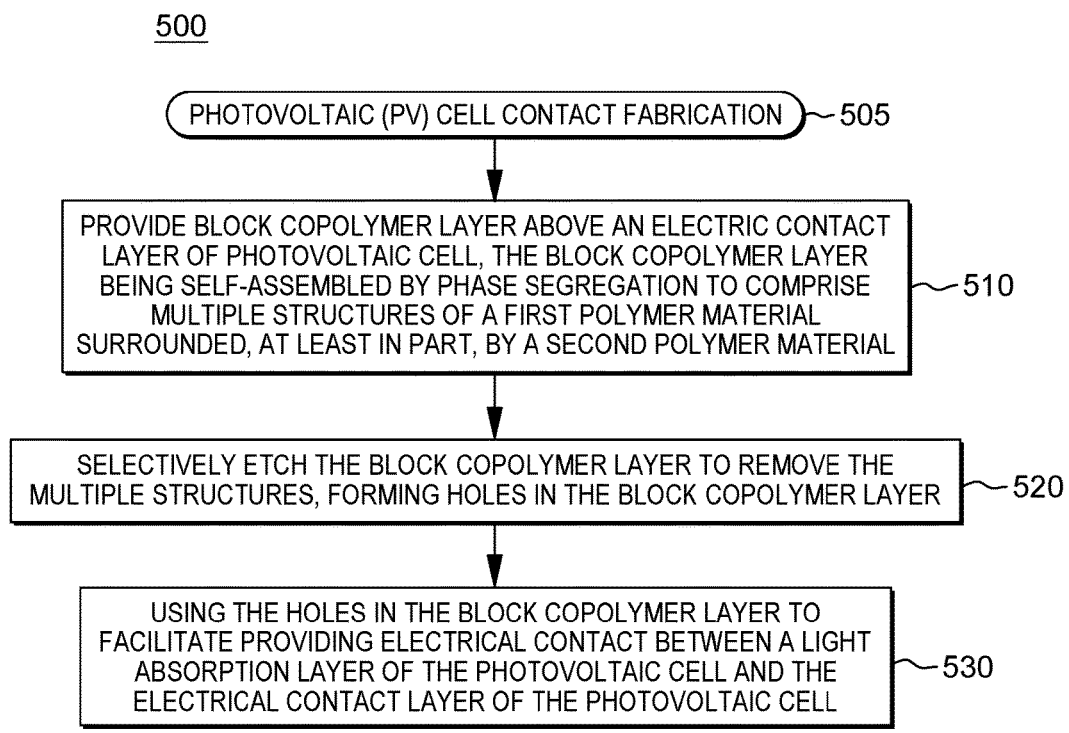
FIG. 5 depicts an embodiment of a process of fabricating photovoltaic cell contacts, in accordance with one or more aspects of the present invention.

As depicted in FIG. 5, provided herein is a fabrication process 500 for photovoltaic (PV) cell contact fabrication 505, in accordance with one or more aspects of the present invention. As illustrated, fabrication process 500 includes providing a block copolymer layer above an electrical contact layer of the photovoltaic cell 510. The block copolymer layer is self-assembled by phase segregation to include multiple structures of a first polymer material surrounded, at least in part, by a second copolymer material. The process also includes annealing the block copolymer layer to dissolve or remove the multiple structures, forming holes in the block copolymer layer 520. The holes in the block copolymer layer are then used to facilitate providing electrical contacts between a light absorption layer of the photovoltaic cell and the electrical contact layer of the photovoltaic cell 530. For instance, as explained above, the holes in the block copolymer layer may be nano-sized holes, or point-contact-sized holes, which may be used to form contact openings in an underlying passivation layer (disposed over the electrical contact layer). For example, the passivation layer may be etched through the holes in the block copolymer layer to form aligned contact openings through the passivation layer, which expose respective portions of the electrical contact layer. Once the holes in the passivation layer are formed, the block copolymer layer may be removed, and the light absorption layer provided, extending into the contact openings through the passivation layer, and making electrical contact with the electrical contact layer. In this manner, small, nano-sized contacts, or point contacts, may be provided to advantageously reduce recombination losses at the contact-to-absorber interface, thereby increasing photovoltaic cell efficiency, while producing the thin-film photovoltaic cell cost effectively.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating photovoltaic cell contacts, the method comprising:
    providing a block copolymer layer above an electrical contact layer of a photovoltaic cell, the block copolymer layer being self-assembled by phase segregation to comprise multiple structures of a first polymer material surrounded, at least in part, by a second polymer material;
    selectively etching the block copolymer layer to remove the multiple structures, forming holes in the block copolymer layer; and
    providing a light absorption layer of the photovoltaic cell in direct physical contact with the electrical contact layer of the photovoltaic cell via multiple point contacts, the multiple point contacts reducing recombination losses at the light absorption layer interface with the electrical contact layer, and the providing the light absorption layer using, in part, the holes in the block copolymer layer in defining the multiple point contacts, wherein the electrical contact layer is a back contact layer or a front contact layer to the light absorption layer of the photovoltaic cell.

2. The method of claim 1, wherein the holes in the block copolymer layer are randomly disposed above the electrical contact layer.

3. The method of claim 1, further comprising providing, prior to providing the block copolymer layer, a passivation layer over the electrical contact layer, the passivation layer comprising a dielectric material, and wherein the method further comprises etching the passivation layer through the holes in the block copolymer layer to form contact openings through the passivation layer, the contact openings through the passivation layer facilitating forming the multiple point contacts.

4. The method of claim 3, further comprising removing the block copolymer layer from above the electrical contact layer, and providing the light absorption layer, the light absorption layer extending into the contact openings through the passivation layer, and forming the multiple point contacts to the electrical contact layer.

5. The method of claim 4, wherein the light absorption layer comprises a thin-film semiconductor material, the thin-film semiconductor material having a thickness of 5 microns or less.

6. The method of claim 5, wherein the thin-film semiconductor material comprises one of cadmium telluride (CdTe), amorphous or other thin-film silicon (a-Si, TF-Si), copper-indium-gallium-selenide/sulfide (CIGS), copper-zinc-tin-sulfide (CZTS), or an organic- or inorganic-Perovskite material.

7. The method of claim 1, wherein the holes in the block copolymer layer are 200 nm in width, or less.

8. A method of fabricating photovoltaic cell contacts, the method comprising:
    providing a block copolymer layer above an electrical contact layer of a photovoltaic cell, the block copolymer layer being self-assembled by phase segregation to comprise multiple structures of a first polymer material surrounded, at least in part, by a second polymer material;

selectively etching the block copolymer layer to remove the multiple structures, forming holes in the block copolymer layer;

using the holes in the block copolymer layer to facilitate providing electrical contacts between a light absorption layer of the photovoltaic cell and the electrical contact layer of the photovoltaic cell;

providing, before depositing the block copolymer layer, a patterned sacrificial layer above the electrical contact layer, the patterned sacrificial layer comprising patterned openings through the patterned sacrificial layer; and the providing of the block copolymer layer comprising depositing the block copolymer layer over the patterned sacrificial layer, including within the patterned openings, wherein the multiple structures of the first polymer material, and thus the holes in the block copolymer layer, are formed within the patterned openings in the patterned sacrificial layer.

9. The method of claim 8, wherein the patterned openings are arrayed within the patterned sacrificial layer.

10. A method of fabricating a photovoltaic cell comprising:

providing an electrical contact layer with a passivation layer over the electrical contact layer, the passivation layer comprising a dielectric material;

providing a block copolymer layer over the passivation layer, the block copolymer layer being self-assembled by phase segregation to comprise multiple structures of a first copolymer material surrounded, at least in part, by a second copolymer material;

selectively etching the block copolymer layer to remove the multiple structures, forming holes in the block copolymer layer;

etching the passivation layer through the holes in the block copolymer layer to form contact openings through the passivation layer; and providing a light absorption layer of the photovoltaic cell, the light absorption layer extending into the contact openings through the passivation layer and directly physically contacting the electrical contact layer, making electrical connection with the electrical contact layer via multiple point contacts, the multiple point contacts reducing recombination losses at the light absorption layer interface with the electrical contact layer, wherein the electrical contact layer is a back contact layer or a front contact layer to the light absorption layer of the photovoltaic cell.

11. The method of claim 10, further comprising:

providing, before depositing the block copolymer layer, a patterned sacrificial layer above the passivation layer, the patterned sacrificial layer comprising patterned openings exposing the passivation layer; and the providing of the block copolymer layer comprising depositing the block copolymer layer over the patterned sacrificial layer, including within the patterned openings, wherein the multiple structures of the first copolymer material, and thus the holes in the block copolymer layer, are formed within the patterned openings in the patterned sacrificial layer.

12. The method of claim 11, wherein the patterned openings are arrayed within the patterned sacrificial layer.

13. The method of claim 11, wherein the holes in the block copolymer layer are smaller in width than the patterned openings in the patterned sacrificial layer.

14. The method of claim 10, wherein the holes in the block copolymer layer are randomly disposed above the passivation layer.

15. The method of claim 10, wherein the contact openings through the passivation layer are aligned to the holes in the block copolymer layer.

16. The method of claim 10, wherein the light absorption layer comprises a thin-film semiconductor material.

17. The method of claim 16, wherein the thin-film semiconductor material comprises one of cadmium telluride (CdTe), amorphous or other thin-film silicon (a-Si, TF-Si), copper-indium-gallium-selenide/sulfide (CIGS), copper-zinc-tin-sulfide (CZTS), or an organic- or inorganic-Perovskite material.

18. The method of claim 10, wherein the holes in the block copolymer layer are 200 nm in width, or less.

* * * * *